United States Patent [19]

Reichmanis et al.

[11] 4,373,018

[45] Feb. 8, 1983

[54] MULTIPLE EXPOSURE MICROLITHOGRAPHY PATTERNING METHOD

[75] Inventors: Elsa Reichmanis, Piscataway; Bernard J. Roman, Summit; King L. Tai, Berkeley Heights; Cletus W. Wilkins, Jr., Plainfield, all of N.J.

[73] Assignee: Bell Telephone Laboratories, Incorporated, Murray Hill, N.J.

[21] Appl. No.: 270,792

[22] Filed: Jun. 5, 1981

[51] Int. Cl.³ .......................... G03C 5/00; G03C 1/76
[52] U.S. Cl. .................................. 430/312; 430/156; 430/313; 430/315; 430/323; 430/324; 430/394; 430/396; 430/273; 430/502; 430/503
[58] Field of Search ............... 430/156, 502, 503, 273, 430/271, 275, 311–321, 322, 323, 325, 326, 394, 396

[56] References Cited

U.S. PATENT DOCUMENTS

| | | | |
|---|---|---|---|
| 4,098,917 | 7/1978 | Bullock et al. | 430/316 |
| 4,127,414 | 11/1978 | Yoshikawa et al. | 430/313 |
| 4,188,215 | 2/1980 | Sato et al. | 430/156 |
| 4,256,825 | 3/1981 | Loprest | 430/503 |
| 4,269,935 | 5/1981 | Masters et al. | 430/314 |
| 4,276,368 | 6/1981 | Heller et al. | 430/313 |

FOREIGN PATENT DOCUMENTS 2517711  11/1976  Fed. Rep. of Germany ...... 430/156

OTHER PUBLICATIONS

Tai et al., J. Vac. Sci. Technol., 16(6), (Nov./Dec. 1979), pp. 1977–1979.

L. T. Romankin et al., "Interlayer Technique for Use to Form Evaporation Lift-Off Masks", *IBM Technical Disclosure Bulletin*, vol. 13, No. 12, May, 1976, pp. 4219–4221.

J. M. Moran et al., "High Resolution, Steep Profile Resist Patterns", *The Bell System Technical Journal*, vol. 58, 1979, pp. 1027–1036.

B. J. Lin, "Portable Conformable Mask–A Hybrid Near-Ultraviolet and Deep-Ultraviolet Patterning Technique", *Proceedings of the Society of Photo–Optical Instrumentation Engineers*, vol. 174: Developments in Semiconductor Microlithography IV (1979), pp. 114–121.

*Primary Examiner*—Mary F. Downey
*Attorney, Agent, or Firm*—Peter A. Businger

[57] ABSTRACT

High-resolution patterning of a device surface is effected by a method which involves the use of a multi-layer resist structure. An organic resist layer is on the surface to be patterned, and an inorganic resist layer is on the organic resist layer. A pattern is produced in the inorganic layer by exposure to actinic radiation and, after development of the inorganic layer, the pattern is replicated in the organic layer by additional exposure to actinic radiation. The pattern is then developed in the organic layer so as to leave exposed surface portions to be affected by a fabrication agent.

6 Claims, 4 Drawing Figures

MULTIPLE EXPOSURE MICROLITHOGRAPHY PATTERNING METHOD

TECHNICAL FIELD

The invention is concerned with surface patterning in the manufacture of devices such as, e.g., integrated circuit and magnetic bubble devices.

BACKGROUND OF THE INVENTION

Surface patterning by selectively depositing, removing, or otherwise influencing portions of surface material plays an important role, e.g., in the manufacture of integrated circuitry on silicon and other semiconductor devices as well as in the manufacture of magnetic bubble devices. Currently, such patterning typically requires the resolution of features as small as a few micrometers, and higher resolution is being sought for future devices. Patterning may be by one of a variety of optical, X-ray, ion beam, or electron beam lithographic methods such as, e.g., contact, proximity, or projection lithography; an alternative, known as "direct writing", involves pattern delineation by controlled positioning of a narrowly focused beam of radiation. (In current practice, this latter method is primarily used for making a first or "master" mask by electron-beam direct writing.)

A pattern is typically delineated, either by direct writing or by replication of a mask pattern, in a device-supported layer of "resist" material and, after exposure to actinic radiation, portions of this material are selectively removed in a development step. Depending on whether a resist material is "positive acting" or "negative acting", either exposed or unexposed portions are removed, respectively. Then, in a fabrication step, exposed device surface portions are preferentially affected.

Instead of a single, homogeneous layer of resist material, multiple-layer structures may be used for various reasons. For example, to facilitate removal of residual resist material after fabrication, a two-layer or three-layer structure may be advantageous as disclosed, e.g., by L. T. Romankiu et al., "Interlayer Technique for Use to Form Evaporation Lift-Off Masks", *IBM Technical Disclosure Bulletin*, Vol. 13, No. 12, May 1976, pp. 4219-4221.

Multi-layer structures have also been designed for enhanced resolution of detail as resulting from more faithful replication of a desired pattern in a resist layer. For example, as described by J. M. Moran et al., "High Resolution, Steep Profile Resist Patterns", *The Bell System Technical Journal*, Vol. 58, 1979, pp. 1027-1036, a topmost layer may serve as a mask for replicating a pattern in an underlying second layer which, in turn, serves as a dry processing mask for a relatively thick bottom layer of a partially polymerized organic material. The thickness of this third layer is chosen sufficient, e.g., to afford coverage of steps in a surface to be patterned while presenting an essentially flat surface to the defining radiation. It is an advantage of this approach that, due to the flatness and opacity of the underlying polymer layer, standing waves of actinic radiation do not cause undue loss of resolution.

Another double layer resist system has been proposed by B. J. Lin, "Portable Conformable Mask—A Hybrid Near-Ultraviolet and Deep-Ultraviolet Patterning Technique", *Proceedings of the Society of Photo-Optical Instrumentation Engineers*, Vol. 174: Developments in Semiconductor Microlithography IV (1979), pp. 114-121. Use of this system involves repeated exposure and development steps affecting diazo-containing and poly(methyl methacrylate) materials.

SUMMARY OF THE INVENTION

High-reslution patterning of a device surface is facilitated in a multi-layer resist structure when a top layer is made from an inorganic radiation sensitive material. A pattern is produced in the inorganic layer by selective exposure to actinic radiation and, after development of the inorganic layer, the pattern is replicated in an underlying organic layer by additional exposure to actinic radiation. The pattern is then developed in the organic layer so as to leave exposed surface portions to be affected by a fabrication agent.

DETAILED DESCRIPTION

The invention provides for surface patterning at some stage of device manufacture, e.g., for producing electrical or magnetic microcircuitry on semiconductor or magnetic bubble devices. Desired surface patterning may involve selective deposition or removal of surface material or, more generally, any selective surface alteration by chemical or physical interaction with a manufacturing agent. While patterning typically affects a layer deposited on a substrate, patterning of the surface of a homogeneous substrate material is not precluded. In fact, for purposes of description of the invention, it is convenient to use the term substrate to designate an object whose surface is to be patterned, and it is understood that such "substrate" may be homogeneous or inhomogeneous.

Figure 1:
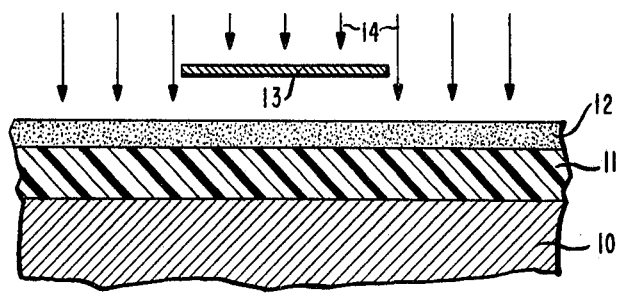
FIGS. 1-4 illustrate processing steps as carried out in the course of device surface patterning in accordance with the invention.

Surface patterning in accordance with the invention calls for the deposition of an organic photoactive resist layer on a substrate; in the following, this layer is designated as a first layer. A second, inorganic photoactive resist layer is deposited on the first layer, and a pattern is produced in the second layer by selective exposure to actinic radiation. This may be in the presence of a mask as illustrated by FIG. 1 which shows substrate 10, first layer 11, second layer 12, and mask 13, incident actinic radiation being depicted by means of arrows 14. Alternatively, a mask may be dispensed with, e.g., when a focused beam of radiation is used in a "direct writing" mode of pattern generation.

Figure 2:
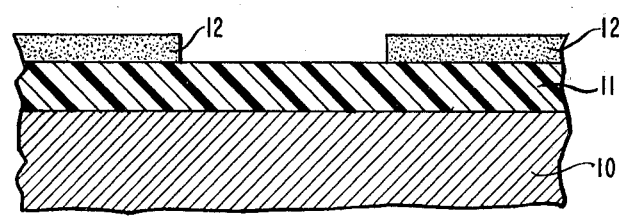

As a result of patterning, relative resistance to a developing agent differs in exposed and unexposed portions of layer 12. In particular, if layer 12 is a "negative acting" resist, exposed portions are more resistant than unexposed portions; conversely, use of a "positive acting" resist results in diminished resistance in exposed portions. In the former case (and as illustrated by FIG. 2), exposure to a developing agent results in removal of unexposed portions of layer 12.

Figure 3:
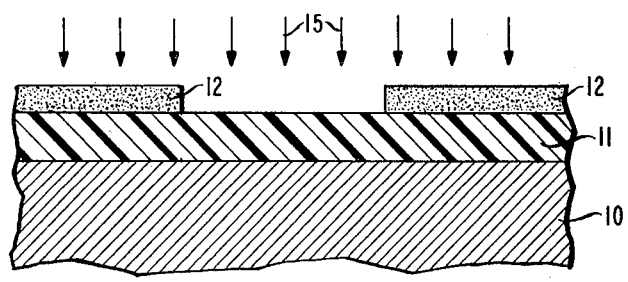
Figure 4:
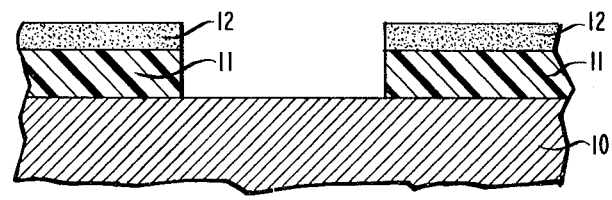

In accordance with the invention, a second exposure to actinic radiation serves to copy the developed pattern from layer 12 into layer 11; this is illustrated by FIG. 3 which shows exposure to actinic radiation 15, and FIG. 4 which shows the result after development. Patterning of substrate 10 may now be effected by exposure to a suitable fabrication agent such as, e.g., a metallic vapor, an etchant solution, a plasma, or an ion beam. Fabrication may result, e.g., in the removal, alteration, or deposition of material.

Selection of one or several materials for the inorganic layer is based on considerations concerning ease of deposition and optical sensitivity; for example, a combination of silver selenide on germanium-selenium is well-suited in both respects. Germanium-selenium may be evaporated from a pre-alloyed body by low-energy electron beam evaporation so as to avoid undue interaction with the underlying organic material, and silver selenide may be formed on the germanium-selenium upon dipping in a silver-containing aqueous solution. Exposure to actinic radiation such as, e.g., ultraviolet radiation having a wavelength in an approximate range of from 200 to 450 nanometers results in diffusion of silver into the germanium-selenium. This purpose may also be served by exposure to a beam of ions, electrons, or X-rays. After removal of undiffused silver from non-exposed portions, exposed portions of the inorganic layer are more resistant to a developing solution.

Inorganic layer thickness may typically be in an approximate range of from 500 to 2000 Angstroms, greater thickness being considered unnecessary for exposed material to effectively block actinic radiation during the second exposure step. The underlying organic layer typically has a thickness in the range of from 1 to 2 micrometers, enabling resolution of features having a width of 1 micrometer or less. Choice of specific thickness is based on considerations concerning detail resolution and adequate protection of the substrate against the fabrication agent, thicker layers providing better protection but less resolution and conversely. As compared with prior art processing in the absence of an inorganic layer, processing in accordance with the invention provides for improved shielding of masked surface portions. Accordingly, the thickness of the organic layer may be reduced for enhanced resolution of a desired pattern. Among further benefits derived from processing in accordance with the invention are the following:

1. Except possibly for the deposition of the inorganic layer, no vacuum processing is required; rather, simple wet processing is sufficient.

2. Wavelength for exposure of the organic layer may be chosen in a wide range and unrestricted by absorption limitations of the inorganic layer. If desired, one and the same source of actinic radiation may be used for both steps of exposure, first in the presence of a mask, and then in a flood exposure mode.

3. For certain resist materials, the same type of aqueous developing solution may be used for both development steps (dilution may preferably differ, however).

4. Processing may provide for a re-entrant structure in which a protective ledge is formed by the inorganic layer over the organic layer. When fabrication is by deposition onto exposed substrate portions, such a ledge provides for a sufficient amount of shielding to facilitate lift-off of the organic material with a suitable agent such as, e.g., acetone.

5. As compared with tri-level patterning methods, alignment of successively produced patterns on a surface is facilitated due to greater transmittance at non-actinic wavelengths.

6. Processing is easily automated and lends itself to batch processing as desirable in commercial production. For example, processing equipment may be designed to carry out at a single work station the entire photoprocessing sequence of steps from stripping of unexposed silver selenide through conformal exposure and development.

7. The organic layer material may be chosen from among currently used organic resist materials, and layer development and substrate fabrication may be by customary processing.

8. As compared with bi-level methods using two organic resist materials, intermixing is minimized at the interface between the organic and inorganic materials.

9. As compared with other known multi-level resist systems there is a possibility of using either positive or negative photoresists as the first resist material. Use of a negative acting first layer is an advantage for the patterning of certain photolithographic levels such as, e.g., so-called via or window levels. To minimize pinholes, such levels are preferably exposed with positive tone masks. If the negative acting inorganic resist were used with a positive acting organic resist, this tone mask would yield a resist cap instead of a desired via hole. The desired resist topology can be obtained, however, when the organic resist material is negative acting also. In this case, the development step may further serve to remove the inorganic masking feature as in a lift-off process described above in paragraph 4.

EXAMPLE 1

A silicon semiconductor device having surface steps approximately 8000 Angstroms high was coated with a layer of organic resist material. This material was furnished by the Shipley Company, Newton, Mass. under the designation AZ1350J; layer thickness was approximately 1.6 micrometer. A layer of germanium-selenium having a nominal composition represented by $Ge_{0.1}Se_{0.9}$ and having a thickness of approximately 0.18 micrometer was deposited on the organic layer by electron beam deposition from a pre-alloyed target, and the germanium-selenium layer was silver-sensitized by dipping into a solution of potassium silver cyanide.

A test pattern having alternating one-micrometer-wide lines and spaces was produced by step-and-repeat printing using a 10-fold reduction optical printer made by the GCA Company. Exposure time was 1.5 seconds per field, and wavelength was 436 nanometers. Silver selenide was stripped from unexposed portions by dipping into a potassium iodide-iodine solution, and development was effected by dipping into an aqueous alkaline solution of a commercial photoresist developer known as AZ351 to which approximately 0.04 M sodium sulfate had been added.

Copying of the developed pattern from the inorganic layer into the organic layer was by flood exposure to a 200 watt high-pressure mercury lamp producing radiation having a typical exposure spectrum with energy peaks at wavelengths of 365, 405, and 436 nanometers. Exposure time was approximately 20 seconds. The pattern was developed in the organic layer by a spray of AZ developer. Inspection by scanning electron microscopy of the developed pattern showed essentially vertical walls.

EXAMPLE 2

A magnetic bubble material having a flat surface and a nominal composition represented by the formula $(Lu_{0.61}Sm_{0.41}Y_{1.18}Ca_{0.79}Ge_{0.79}Fe_{4.2}O_{12})$ was coated with layers as described above in Example 1 except that the organic layer had a thickness of approximately 1.1 micrometer and the inorganic layer had a thickness of approximately 0.2 micrometer. Initial exposure of an ion implant propagation pattern was by contact printing using exposure to a 200 watt high-pressure mercury lamp for approximately 80 seconds. Development of the inorganic layer, copying into the organic layer, and development of the organic layer were as described above in Example 1. Inspection by scanning electron microscopy showed 0.5-micrometer features to be clearly defined in the resist.

To produce a working magnetic bubble device, exposed garnet surface portions were implanted with neon and hydrogen ions using the composite resist as an effective implantation stopping layer. Energy was 270 kV for neon and 130 kV for hydrogen ions, and dosage was $2 \times 10^{14}$ per cm$^2$ and $2 \times 10^{16}$ per cm$^2$, respectively. The composite resist was stripped in a fluoroform-oxygen plasma, magnetic bubbles were nucleated in the implanted portion of the magnetic bubble material, and bubbles were propagated along test paths defined by implanted regions. Propagation in a 40 oersted rotating magnetic field was as good or better in comparison with propagation in a device made by prior art patterning using AZ resist having a thickness of 1.7 micrometer.

EXAMPLE 3

A silicon semiconductor substrate was coated, by spinning, with a layer of poly(methyl methacrylate), PMMA, approximately 1.5 micrometer thick. This material was obtained from the Dupont company as Elvacite 2010 and was dissolved, 10 percent by weight, into chlorobenzene and filtered prior to spinning. After spinning, the material was heated to a temperature of approximately 160 degrees Celsius for one hour. A layer of germanium-selenium having a thickness of approximately 0.18 micrometer was deposited onto the PMMA by electron deposition, and the germanium-selenium layer was silver sensitized as in Example 1. Initial exposure was by contact printing, using the full output of a 1 kilowatt mercury lamp for approximately 7 seconds. The inorganic layer was then developed as in Example 1. Copying of the developed pattern into the PMMA layer was by flood exposure using a 1 kilowatt mercury lamp having an energy peak at a wavelength of 220 nanometers. Exposure time was approximately 20 minutes. The pattern was developed into the PMMA layer using methyl isobutyl ketone. Inspection by scanning electron microscopy of the developed pattern showed submicron features well resolved.

What is claimed is:

1. Method for making an article, said method comprising patterning a surface by alteration of at least one selected portion of said surface, patterning comprising depositing on said surface a first layer which consists essentially of an organic radiation-sensitive material, depositing on said first layer a second layer which consists essentially of silver-sensitized germanium-selenium, exposing at least one area of said second layer to first actinic radiation so as to define a pattern in said second layer, developing said pattern in said second layer by removal either of said area of said second layer or of a domain of said second layer which is complementary to said area of said second layer so as to expose at least one region of said first layer, exposing at least said region of said first layer to second actinic radiation so as to replicate said pattern in said first layer, developing said pattern in said second layer by removal of said area or domain of said first layer so as to expose said selected portion of said surface, and altering said selected portion of said surface by exposure to a fabrication agent.

2. Method of claim 1 in which altering said at least one portion of said surface by exposure to a fabrication agent results in the removal of material from said portion of said surface.

3. Method of claim 1 in which altering said at least one portion of said surface by exposure to a fabrication agent results in the deposition of material on said portion of said surface.

4. Method of claim 1 in which the thickness of said first layer is in the range of from 1 to 2 micrometers.

5. Method of claim 1 in which the thickness of said second layer is in the range of from 500 to 2000 Angstroms.

6. Method of claim 1 in which said second actinic radiation has relative intensities at different wavelengths which are essentially the same as in said first actinic radiation.

* * * * *